(12) United States Patent
Singh et al.

(10) Patent No.: US 11,070,177 B2
(45) Date of Patent: Jul. 20, 2021

(54) MINIMIZING CROSSOVER DISTORTION IN A CLASS B CURRENT DRIVER

(71) Applicant: Cirrus Logic International Semiconductor Ltd., Edinburgh (GB)

(72) Inventors: Saurabh Singh, Cedar Park, TX (US); Vamsikrishna Parupalli, Austin, TX (US); Stewart Kenly, Austin, TX (US); Eric B. Smith, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 165 days.

(21) Appl. No.: 16/562,856

(22) Filed: Sep. 6, 2019

(65) Prior Publication Data

US 2021/0075382 A1    Mar. 11, 2021

(51) Int. Cl.
  *G02B 7/04*   (2021.01)
  *H03F 3/21*   (2006.01)
  *G02B 27/64*  (2006.01)

(52) U.S. Cl.
  CPC ............... *H03F 3/21* (2013.01); *G02B 7/04* (2013.01); *G02B 27/646* (2013.01); *H03F 2200/33* (2013.01)

(58) Field of Classification Search
  CPC  G02B 7/04; G02B 27/646; H03F 3/21; H03F 2200/33; G03B 5/00; G03B 5/02; H04N 5/23212; H04N 5/232

USPC ...................................... 359/554; 348/208.11
  See application file for complete search history.

(56) References Cited

U.S. PATENT DOCUMENTS

| | | | | |
|---|---|---|---|---|
| 5,550,450 A * | 8/1996 | Palko | ................ | H02M 7/53875 187/316 |
| 6,995,537 B1 * | 2/2006 | Plutowski | ............ | G11B 5/5565 318/400.04 |
| 9,219,414 B2 * | 12/2015 | Shao | ...................... | H02M 3/157 |
| 9,735,574 B2 * | 8/2017 | Tournatory | ............... | H02J 3/00 |
| 2014/0210266 A1 * | 7/2014 | Tournatory | ............... | H02J 3/00 307/31 |
| 2015/0115923 A1 * | 4/2015 | Shao | ...................... | H02M 3/157 323/283 |
| 2019/0212703 A1 * | 7/2019 | Yao | ...................... | H03L 7/0891 |

* cited by examiner

*Primary Examiner* — William R Alexander
(74) *Attorney, Agent, or Firm* — Jackson Walker L.L.P.

(57) ABSTRACT

A system may include an output stage comprising a single-ended driver for driving a load at an output of the output stage, a loop filter coupled at its input to the output of the output stage and configured to minimize an error between a target current signal received by the loop filter and an output current driven on the load, and control circuitry configured to, when the load current is driven in a manner such that the load current changes polarity, reset a state variable of the loop filter.

21 Claims, 4 Drawing Sheets

MINIMIZING CROSSOVER DISTORTION IN A CLASS B CURRENT DRIVER

FIELD OF DISCLOSURE

The present disclosure relates in general to electronic devices, and more particularly, to closed loop control in circuits driving an output current signal, including a camera module.

BACKGROUND

Many traditional mobile devices (e.g., mobile phones) include one or more cameras for capturing images. To provide for image stabilization and focus, a position of a camera within a plane substantially parallel to a subject of an image as well as a position of a lens of the camera in a direction perpendicular to such plane, may be controlled by a plurality of motors under the control of a camera controller. A control system may be implemented using an applications processor of the mobile device coupled via a communication interface (e.g., an Inter-Integrated Circuit or I2C interface) to a camera controller local to the camera and its various motors. For example, the applications processor may communicate to the camera controller a vector of data regarding a target position for an applications processor, whereas the camera controller may communicate to the applications processor a vector regarding an actual position of the camera, as sensed by a plurality of magnetic sensors (e.g., Hall sensors) and/or other appropriate sensors.

The motors of a camera may require to be driven by an electrical current, rather than an electrical voltage as is the case for other types of transducer loads. In addition, applications other than camera motors may require a current drive, such as haptic devices, for example. In such systems in which an electrical current is driven into a load, a mechanical mass's position may be controlled in space by providing a force which is generated by the electrical current. Driving the current as a pulse-width modulated (PWM) signal may maximize power efficiency of a system, while driving a linear current at the cost of power efficiency may improve accuracy due to lower noise in a linear driver compared to that of a PWM driver. Accordingly, it may be beneficial to provide a multi-mode current driver switchable between a PWM drive and a linear drive. An example of such a multi-mode current driver switchable between a PWM drive and a linear drive is described in U.S. application Ser. No. 16/431,276, filed Jun. 4, 2019, and entitled "Closed Loop Control in a Camera Module" (the '276 Application), which is incorporated by reference herein in its entirety.

In the '276 Application, single-sided drivers (e.g., Class B drivers) are used instead of differential drivers to drive an output load, as the applications for which the '276 Application may be used may be sensitive to electromagnetic radiation, and the use of single-sided drivers may reduce the amount of switching nodes in a circuit. For current drivers that rely on voltage-mode driver to create a desired load current, such as that described in the '276 Application, the crossover of current direction (e.g., change in polarity of current) may lead to signal distortion, as is explained in greater detail elsewhere in this disclosure. Accordingly, approaches that provide for single-sided drivers while reducing or eliminating distortion due to current crossover are desired.

SUMMARY

In accordance with the teachings of the present disclosure, the disadvantages and problems associated with controlling distortion in a single-sided current driver may be reduced or eliminated.

In accordance with embodiments of the present disclosure, a system may include an output stage comprising a single-ended driver for driving a load at an output of the output stage, a loop filter coupled at its input to the output of the output stage and configured to minimize an error between a target current signal received by the loop filter and an output current driven on the load, and control circuitry configured to, when the load current is driven in a manner such that the load current changes polarity, reset a state variable of the loop filter.

In accordance with these and other embodiments of the present disclosure, a method may include driving a load at an output of an output stage with a single-ended driver of the output stage, minimizing an error between a target current signal and an output current driven on the load by a loop filter coupled at its input to the output of the output stage, and when the load current is driven in a manner such that the load current changes polarity, resetting a state variable of the loop filter.

In accordance with these and other embodiments of the present disclosure, a device may include a camera and a camera module for controlling the camera, the camera module including a control subsystem comprising an output stage comprising a single-ended driver for driving a load at an output of the output stage, a loop filter coupled at its input to the output of the output stage and configured to minimize an error between a target current signal received by the loop filter and an output current driven on the load, and control circuitry configured to, when the load current is driven in a manner such that the load current changes polarity, reset a state variable of the loop filter.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
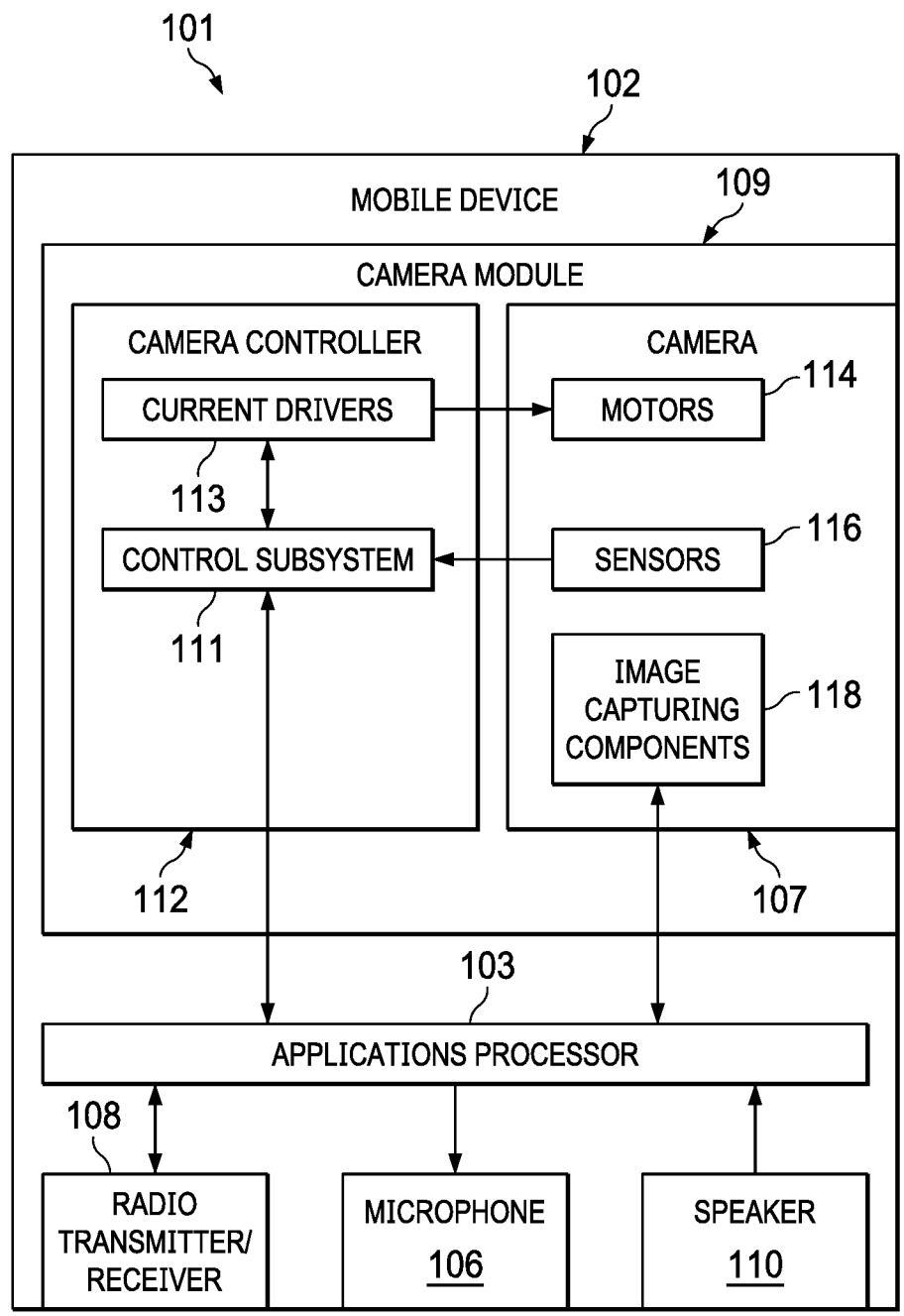
FIG. 1 illustrates a block diagram of selected components of an example mobile device, in accordance with embodiments of the present disclosure.

FIG. 1 illustrates a block diagram of selected components of an example mobile device 102, in accordance with embodiments of the present disclosure. As shown in FIG. 1, mobile device 102 may comprise an enclosure 101, an applications processor 103, a microphone 106, a radio transmitter/receiver 108, a speaker 110, and a camera module 109 comprising a camera 107 and a camera controller 112.

Enclosure 101 may comprise any suitable housing, casing, or other enclosure for housing the various components of mobile device 102. Enclosure 101 may be constructed from plastic, metal, and/or any other suitable materials. In addition, enclosure 101 may be adapted (e.g., sized and shaped) such that mobile device 102 is readily transported on a person of a user of mobile device 102. Accordingly, mobile device 102 may include but is not limited to a smart phone, a tablet computing device, a handheld computing device, a personal digital assistant, a notebook computer, a video game controller, or any other device that may be readily transported on a person of a user of mobile device 102.

Applications processor 103 may be housed within enclosure 101 and may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, applications processor 103 may interpret and/or execute program instructions and/or process data stored in a memory (not explicitly shown) and/or other computer-readable media accessible to applications processor 103.

Microphone 106 may be housed at least partially within enclosure 101, may be communicatively coupled to applications processor 103, and may comprise any system, device, or apparatus configured to convert sound incident at microphone 106 to an electrical signal that may be processed by applications processor 103, wherein such sound is converted to an electrical signal using a diaphragm or membrane having an electrical capacitance that varies based on sonic vibrations received at the diaphragm or membrane. Microphone 106 may include an electrostatic microphone, a condenser microphone, an electret microphone, a microelectromechanical systems (MEMs) microphone, or any other suitable capacitive microphone.

Radio transmitter/receiver 108 may be housed within enclosure 101, may be communicatively coupled to applications processor 103, and may include any system, device, or apparatus configured to, with the aid of an antenna, generate and transmit radio-frequency signals as well as receive radio-frequency signals and convert the information carried by such received signals into a form usable by applications processor 103. Radio transmitter/receiver 108 may be configured to transmit and/or receive various types of radio-frequency signals, including without limitation, cellular communications (e.g., 2G, 3G, 4G, LTE, etc.), short-range wireless communications (e.g., BLUETOOTH), commercial radio signals, television signals, satellite radio signals (e.g., GPS), Wireless Fidelity, etc.

Speaker 110 may be housed at least partially within enclosure 101 or may be external to enclosure 101, may be communicatively coupled to applications processor 103, and may comprise any system, device, or apparatus configured to produce sound in response to electrical audio signal input. In some embodiments, speaker 110 may comprise a dynamic loudspeaker, which employs a lightweight diaphragm mechanically coupled to a rigid frame via a flexible suspension that constrains a voice coil to move axially through a magnetic gap. When an electrical signal is applied to the voice coil, a magnetic field is created by the electric current in the voice coil, making it a variable electromagnet. The voice coil and the driver's magnetic system interact, generating a mechanical force that causes the voice coil (and thus, the attached cone) to move back and forth, thereby reproducing sound under the control of the applied electrical signal coming from the amplifier.

Camera 107 may be housed at least partially within enclosure 101 (and partially outside of enclosure 101, to enable light to enter a lens of camera 107), and may include any suitable system, device, or apparatus for recording images (moving or still) into one or more electrical signals that may be processed by applications processor 103. As shown in FIG. 1, camera 107 may include a plurality of motors 114, sensors 116, and image capturing components 118.

Image capturing components 118 may include a collection of components configured to capture an image, including without limitation one or more lenses and image sensors for sensing intensities and wavelengths of received light. Such image capturing components 118 may be coupled to applications processor 103 such that camera 107 may communicate captured images to applications processor 103.

Motors 114 may be mechanically coupled to one or more of image capturing components 118, and each motor 114 may include any suitable system, device, or apparatus configured to, based on current signals received from camera controller 112 indicative of a desired camera position, cause mechanical motion of such one or more image capturing components 118 to a desired camera position.

Sensors 116 may be mechanically coupled to one or more of image capturing components 118 and/or motors 114 and may be configured to sense a position associated with camera 107. For example, a first sensor 116 may sense a first position (e.g., x-position) of camera 107 with respect to a first linear direction, a second sensor 116 may sense a second position (e.g., y-position) of camera 107 with respect to a second linear direction normal to the first linear direction, and a third sensor 116 may sense a third position (e.g., z-position) of camera 107 (e.g., position of lens) with respect to a third linear direction normal to the first linear direction and the second linear direction.

Camera controller 112 may be housed within enclosure 101, may be communicatively coupled to camera 107 and applications processor 103 (e.g., via an Inter-Integrated Circuit (I2C) interface), and may include any system, device, or apparatus configured to control motors 114 or other components of camera 107 to place components of camera 107 into a desired position. Camera controller 112 may also be configured to receive signals from sensors 116 regarding an actual position of camera 107 and/or regarding a status of camera 107. As shown in FIG. 1, camera controller 112 may include a control subsystem 111 and current drivers 113.

Control subsystem 111 may be integral to camera controller 112, and may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, control subsystem 111 may interpret and/or execute program instructions and/or process data stored in a memory and/or other computer-readable media accessible to control subsystem 111. Specifically, control subsystem 111 may be configured to perform functionality of camera controller 112, including but not limited to control of motors 114 and receipt and processing of data from sensors 116.

Current drivers 113 may comprise a plurality of circuits, each such circuit configured to receive one or more control signals from control subsystem 111 (including without limitation a signal indicative of a desired target current for a motor 114) and drive a current-mode signal to a respective motor 114 in accordance with the one or more control signals in order to control operation of such respective motor 114. In some embodiments, one or more of current drivers 113 may comprise a multi-mode current driver as described in greater detail below with respect to FIGS. 2 and 3.

Figure 2:
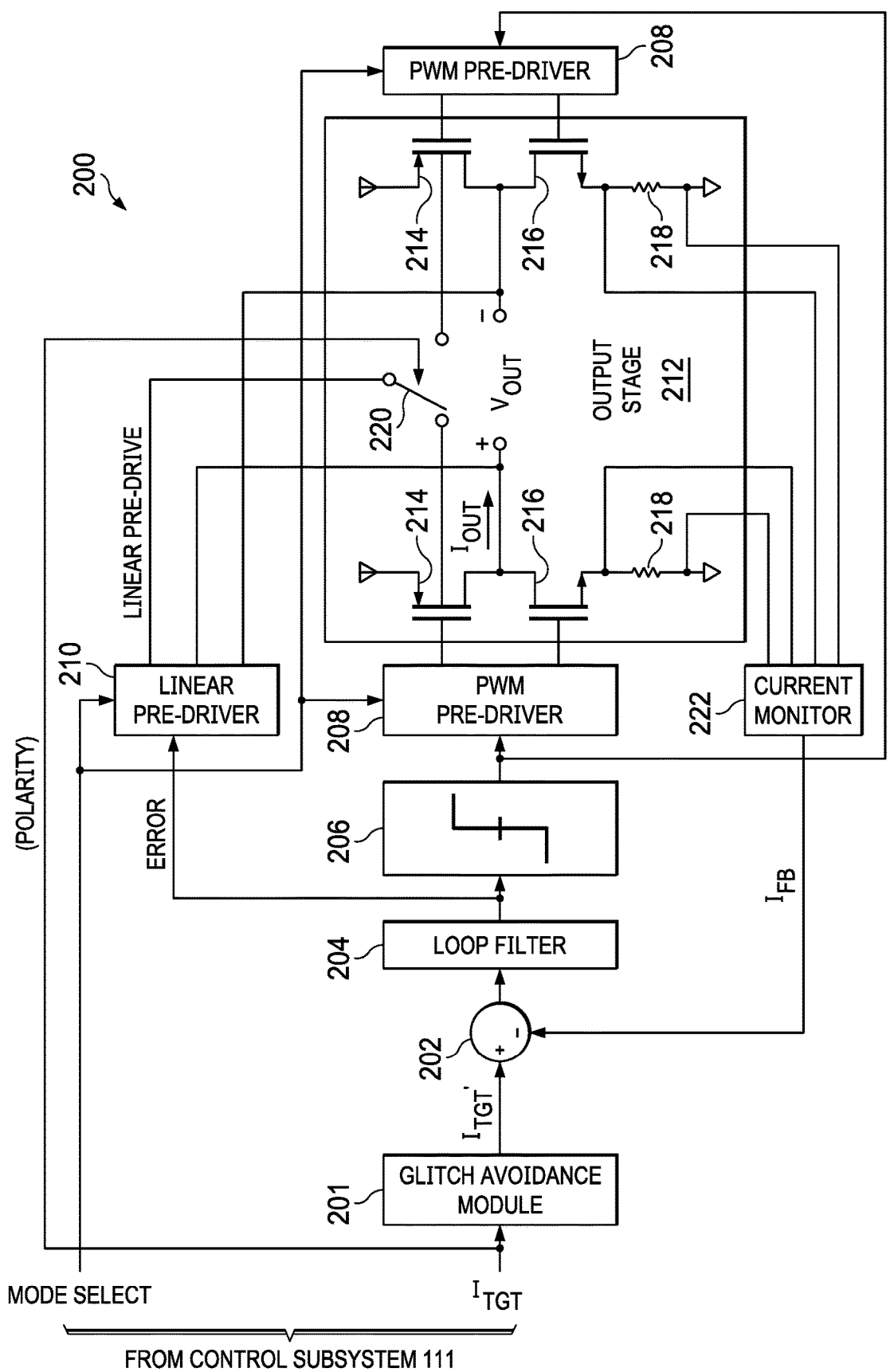
FIG. 2 illustrates a block diagram of selected components of an example multi-mode current driver, in accordance with embodiments of the present disclosure.

FIG. 2 illustrates a block diagram of selected components of an example multi-mode current driver 200, in accordance with embodiments of the present disclosure. In some embodiments, multi-mode current driver 200 may be used to implement one or more of current drivers 113 of FIG. 1. As shown in FIG. 2, multi-mode current driver 200 may comprise a glitch avoidance module 201, a combiner 202, a loop filter 204, a quantizer 206, a PWM pre-driver 208 (which may be split into two as shown in FIG. 2 to generate differential pre-driver signals), a linear pre-driver 210, an output stage 212, and a current monitor 222.

Glitch avoidance module 201 may comprise any system, device, or apparatus configured to, as is described in greater detail elsewhere in this disclosure, minimize distortion due to current crossover (e.g., change in current polarity) in multi-mode current driver 200. Thus, as shown in FIG. 2, glitch avoidance module 201 may receive a target current signal $I_{TGT}$ from control subsystem 111 and modify target current signal $I_{TGT}$ as described in greater detail below in order to generate modified target current signal $I_{TGT}'$. In some embodiments, glitch avoidance module 201 may be integral to control subsystem 111 shown in FIG. 1.

Combiner 202 may comprise any system, device, or apparatus configured to generate an error signal equal to the difference of modified target current signal $I_{TGT}'$ and a measured feedback current $I_{FB}$.

Loop filter 204 may comprise any system, device, or apparatus configured to receive the error signal from combiner 202 and generate a filtered error signal ERROR to be communicated to quantizer 206 and linear pre-driver 210. In some embodiments, loop filter 204 may comprise a proportional-integral-derivative (PID) controller.

Quantizer 206 may comprise any system, device, or apparatus configured to quantize a signal (e.g., filtered error signal ERROR) to generate an equivalent digital PWM signal.

PWM pre-driver 208 may comprise any system, device, or apparatus configured to receive a quantized PWM signal (e.g., from quantizer 206) and condition such signal for output stage 212. Accordingly, PWM pre-driver 208 may comprise a signal buffer and/or other logic elements to provide control of gate terminals of switches of output stage 212. As shown in FIG. 2, PWM pre-driver 208 may be split into two parts, such that one part of PWM pre-driver 208 may generate a first differential pre-drive signal that is a complement of a second differential pre-drive signal driven by the other part of PWM pre-driver 208.

Linear pre-driver 210 may comprise any system, device, or apparatus configured to generate a linear pre-drive signal LINEAR PRE-DRIVE to output stage 212, wherein such linear pre-drive signal LINEAR PRE-DRIVE is a linear function of filtered error signal ERROR. Accordingly, linear pre-driver 210 may implement a linear amplifier. An example embodiment of linear pre-driver 210 is set forth in FIG. 3, discussed in greater detail below.

Output stage 212 may comprise any system, device, or apparatus configured to receive either a quantized PWM signal (e.g., as generated and conditioned by PWM pre-driver 208) or a linear pre-drive signal LINEAR PRE-DRIVE and drive an output current signal $I_{OUT}$ to a load (e.g., an inductive load such as a motor 114 of a camera 107 or a haptic transducer), wherein the output current signal $I_{OUT}$ tracks target current signal $I_{TGT}$. Accordingly, output stage 212 may comprise a plurality of output switches 214 and 216 configured (e.g., in an H-bridge configuration) to generate output current signal $I_{OUT}$ from a modulated signal generated by PWM pre-driver 208 or a linear signal generated by linear pre-driver 210.

As shown in FIG. 2, output stage 212 may include polarity switch 220. When operating in the linear mode of operation, as described in greater detail elsewhere in this disclosure, polarity switch 220 may switch in response to the polarity of target current $I_{TGT}$, in order to generate an appropriate polarity of output current $I_{OUT}$.

Current monitor 222 may comprise any system, device, or apparatus configured to sense a voltage drop across a sense resistor 218 of output stage 212, wherein such voltage drop is indicative of output current signal $I_{OUT}$ and generate feedback current signal $I_{FB}$.

Figure 3:
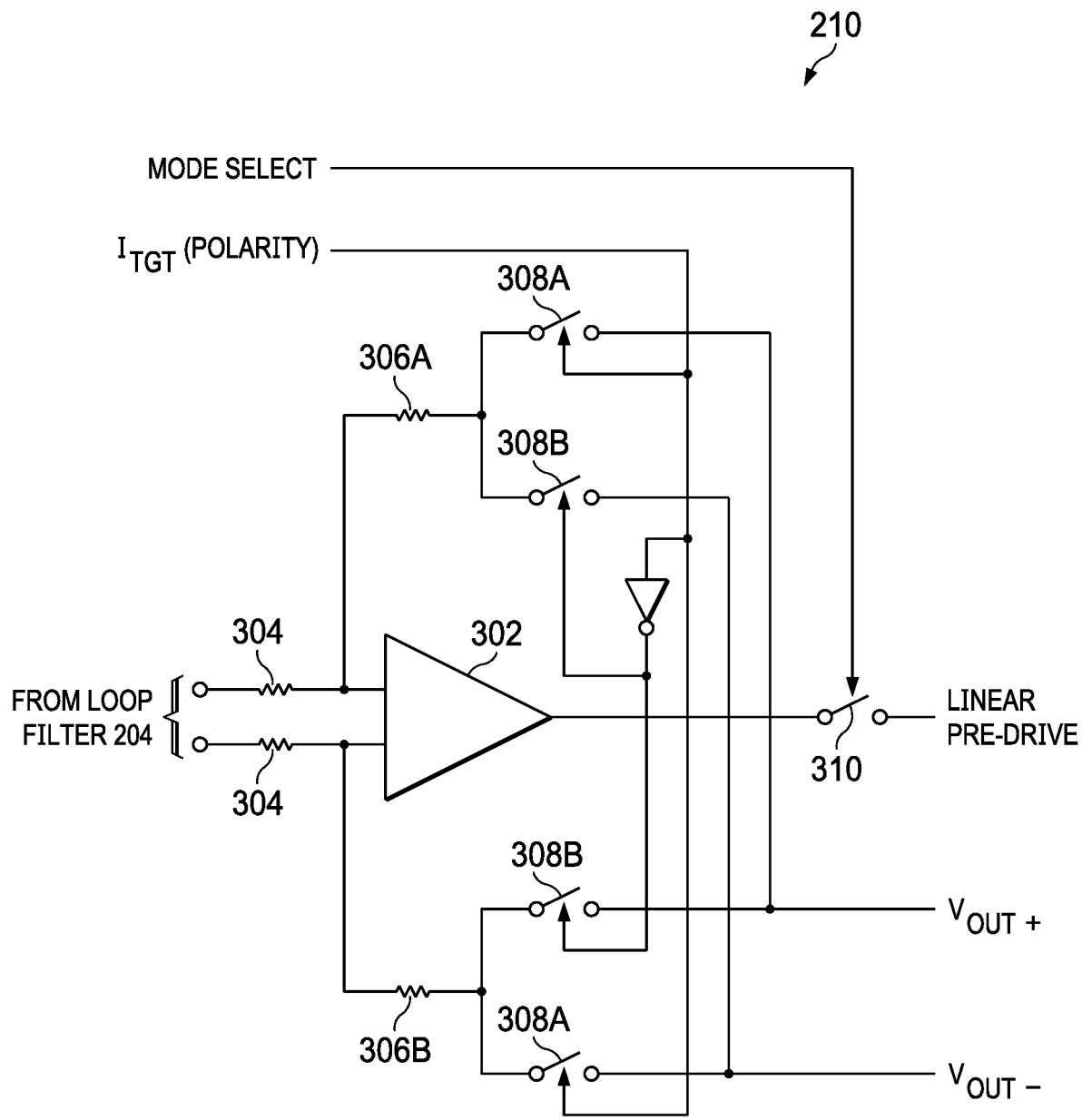
FIG. 3 illustrates a block diagram of selected components of an example linear pre-driver, in accordance with embodiments of the present disclosure.

FIG. 3 illustrates a block diagram of selected components of example linear pre-driver 210, in accordance with embodiments of the present disclosure. As shown in FIG. 3, linear pre-driver 210 may be implemented as differential-input operational amplifier 302 with input resistors 304 each coupled to a respective input of operational amplifier 302 and feedback resistors 306 (e.g., feedback resistor 306A and 306B) coupled between a respective input of operational amplifier 302 and a respective pair of switches 308A and 308B. As will be appreciated by those of skill in the art, a signal gain of linear pre-driver 210 may be set by the resistances of input resistors 304 and feedback resistors 306. During operation of linear pre-driver 210, when a polarity of target current $I_{TGT}$ is positive, switches 308A may be enabled (e.g., activated, on, closed) and switches 308B may be disabled (e.g., deactivated, off, open) such that feedback resistors 306A and 306B are coupled to output nodes $V_{OUT^+}$ and $V_{OUT^-}$, respectively, of output stage 212. Conversely, when the polarity of target current $I_{TGT}$ is negative, switches 308B may be enabled and switched 308A may be disabled such that feedback resistors 306A and 306B are coupled to output nodes $V_{OUT^-}$ and $V_{OUT^+}$, respectively, of output stage 212. Furthermore, linear pre-driver 210 may be configured to receive a mode selection signal MODE SELECT (e.g., from control subsystem 111), such that when mode selection signal MODE SELECT indicates that a linear mode of operation is selected, switch 310 may be enabled, thus allowing linear pre-driver 210 to drive linear pre-drive signal LINEAR PRE-DRIVE to output stage 212. Conversely, when mode selection signal MODE SELECT indicates that a PWM mode of operation is selected, switch 310 may be disabled (e.g., deactivated, off, open), thus causing linear pre-driver 210 to have a high output impedance (e.g., "tri-stating" the output of linear pre-driver 210). Although not explicitly shown in the FIGURES, PWM pre-driver 208 may also be similarly selectively enabled and disabled based on mode selection signal MODE SELECT.

Accordingly, in operation, control subsystem 111 may selectively assert and deassert mode selection signal MODE SELECT in order to switch between operation of multi-mode current driver 200 in a linear mode of operation in which output stage 212 is pre-driven by linear pre-driver 210 and a PWM mode of operation in which output stage 212 is pre-driven by PWM pre-driver 208. Thus, in systems in which multi-mode current driver 200 drives movement of a slow-moving mass, as may be the case with respect to motors 114 of camera 107, multi-mode current driver 200 may operate in the PWM mode of operation at most times to provide coarse location control to place a camera lens in an approximate desired position, and switch to the linear mode of operation just prior to image capture to provide fine location control with less noise than may be present in PWM mode. Furthermore, to minimize or eliminate signal artifacts associated with such switching, multi-mode current driver 200 may be configured to maintain a constant output current $I_{OUT}$ to its load such that a position of the mechanical mass is unchanged during such change between modes of operation.

To further illustrate, during the PWM mode of operation, switches 214 and 216 of output stage 212 may switch at a duty cycle necessary to generate a desired average output current $I_{OUT}$. Thus, quantizer 206 may generate a PWM waveform that may set an output voltage proportional to the mathematical product of the duty cycle multiplied by a supply voltage of output stage 212. However, current monitor 222 senses a current which may have a phase shift relative to the voltage driven due to presence of a partially reactive load, causing a pole between output stage 212 and current monitor 222. Accordingly, a compensator may be present within PID control of loop filter 204 to ensure loop stability in presence of this load pole. In addition, the architecture of quantizer 206 may be chosen to provide a fixed gain from the output of loop filter 204 to output stage 212 across a wide operating range of the supply voltage and switching frequency of output stage 212, in order to ease loop stabilization.

In the linear mode, in order to achieve fast settling and minimal error when the mode of operation is switched from the PWM mode of operation to the linear mode of operation, and vice versa, the architecture of linear pre-driver 210 may be chosen to have loop characteristics substantially similar to that of the combination of quantizer 206 and PWM pre-driver 208. Thus, linear pre-driver 210 may be part of a localized loop amplifier whose gain is matched to the combination of quantizer 206 and PWM pre-driver 208, such that a localized loop amplifier may drive a voltage that creates the desired current through the load of multi-mode current driver 200. A settled state variable (e.g., output of loop filter 204) may be matched in both the linear and PWM modes of operation for a given output load and output current $I_{OUT}$ driven.

Thus, the foregoing discussion discloses a system that includes an output stage (e.g., output stage 212) for driving a load at an output of the output stage, a pulse-width modulation mode path (e.g., combination of quantizer 206 and PWM pre-driver 208) configured to pre-drive the output stage in a first mode of operation (e.g., the PWM mode of operation), a linear mode path (e.g., linear pre-driver 210) configured to pre-drive the output stage in a second mode of operation (e.g., the linear mode of operation), and a loop filter (e.g., loop filter 204) coupled at its input to the output of the output stage and coupled at its output to both the pulse-width modulation mode path and the linear mode path. Further, as discussed above, the pulse-width modulation mode path and the linear mode path may be matched in characteristics such that a first transfer function between the output of the loop filter and the output of the output stage is substantially equivalent to a second transfer function between the output of the loop filter and the output of the output stage.

As described above, in operation of multi-mode current driver 200, current monitor 222 may sense a voltage drop indicative of output current signal $I_{OUT}$ and generate feedback current signal $I_{FB}$ indicative of such sensed output current signal $I_{OUT}$. Combiner 202 may generate an error signal equal to the difference between modified target current signal $I_{TGT'}$ and feedback current signal $I_{FB}$, and loop filter 204 may operate to minimize such error.

In single-sided drivers, such as those implemented by output switches 214 and 216 depending on the polarity of desired output current signal $I_{OUT}$, one side of the output of multi-mode current driver 200 may be strongly driven to a rail voltage (e.g., a supply voltage or ground voltage) while the other side of the output of multi-mode current driver 200 may be modulated to generate desired output current signal $I_{OUT}$. Thus, when the polarity of output current signal $I_{OUT}$ changes, the function of the output drivers implemented by output switches 214 and 216 may reverse to change such current polarity.

Before such change in polarity, the target current signal $I_{TGT}$ required to drive a zero load current will not immediately cause load current to become zero due to group delay of loop filter 204 and the lag of output current signal $I_{OUT}$ relative to driven output voltage $V_{OUT}$. Thus, in the absence of glitch avoidance module 201 (e.g., if modified target current signal $I_{TGT'}$=target current signal $I_{TGT}$), a glitch may occur at the output of multi-mode current driver 200, leading to signal distortion.

To illustrate the source of such glitch, consider target current signal $I_{TGT}$ is a decreasing ramp signal and assume that glitch avoidance module 201 has no functionality (e.g., modified target current signal $I_{TGT'}$=target current signal $I_{TGT}$). In such a scenario, when target current signal $I_{TGT}$ has reached zero, the sensed feedback current signal $I_{FB}$ is not zero. If target current signal $I_{TGT}$ were then to remain at zero, the slope at which sensed feedback current signal $I_{FB}$ approaches zero may decrease due to reduction in the error signal accumulated by loop filter 204. Due to this reduction in slope at the output, the time that target current signal $I_{TGT}$ needs to drive zero may increase before the polarity of output current signal $I_{OUT}$ can change in order to avoid distortion. To avoid this long dwell time, glitch avoidance module 201 may be utilized in a manner similar or identical to that described below.

Figure 4:
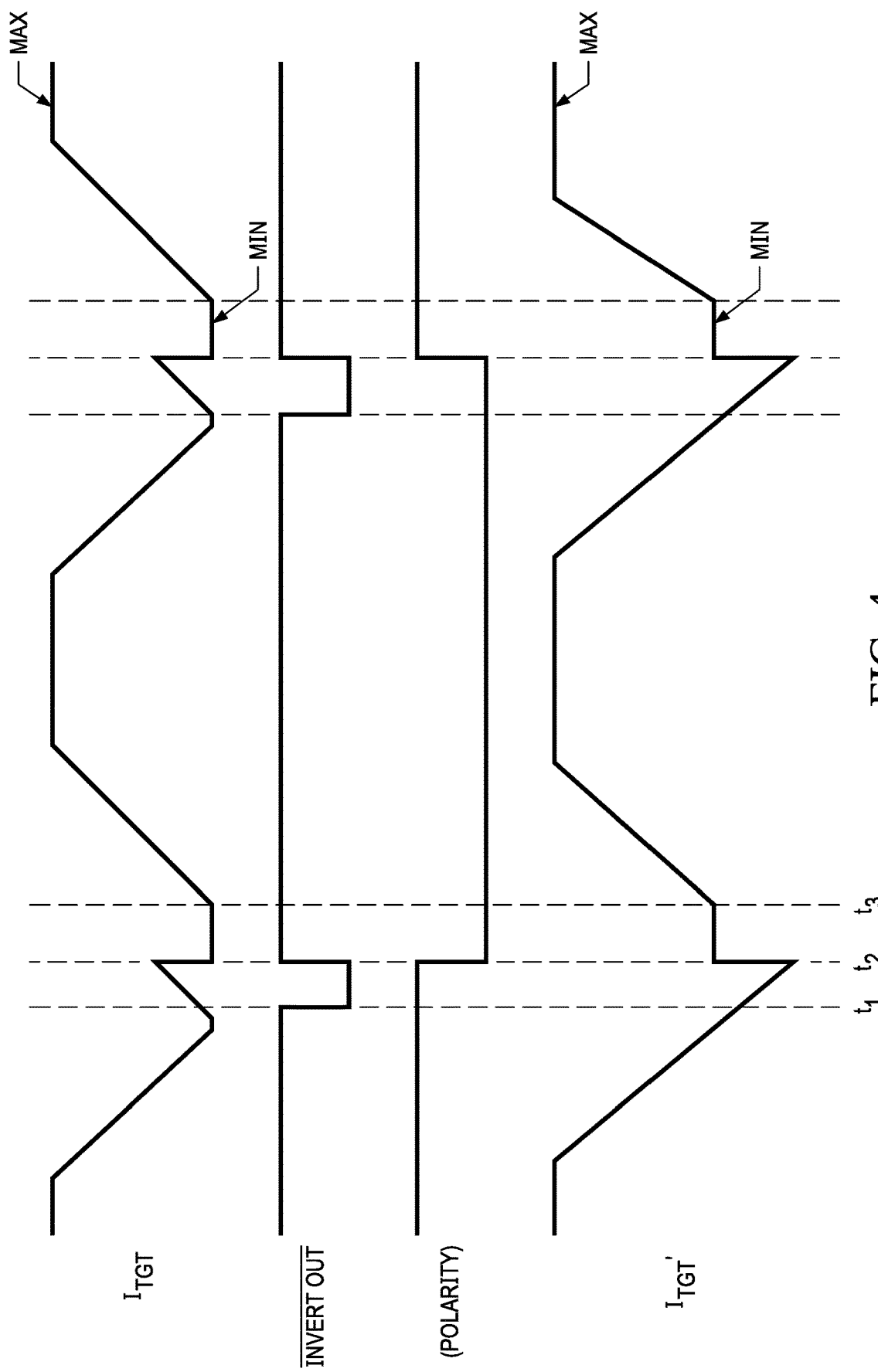
FIG. 4 illustrates a timing diagram of various signals shown in FIG. 2 in order to illustrate example functionality of a glitch avoidance module, in accordance with embodiments of the present disclosure.

FIG. 4 illustrates a timing diagram of various signals shown in FIG. 2 to illustrate functionality of glitch avoidance module 201, in accordance with embodiments of the present disclosure.

To avoid a long dwell time of target current signal $I_{TGT}$ at zero otherwise needed to reduce or eliminate distortion, when output current signal $I_{OUT}$ is driven such that a magnitude of output current signal $I_{OUT}$ approaches zero in order to change polarity, glitch avoidance module 201 may cause target current signal $I_{TGT}$ to experience a ramping increase in magnitude but change in polarity during a period of time between times $t_1$ and $t_2$ depicted in FIG. 4. The plot for INVERTOUT shows the timing of the change in polarity applied to target current signal $I_{TGT}$ in order to generate modified target current signal $I_{TGT'}$ (e.g., no change to polarity when $\overline{\text{INVERTOUT}}$ is asserted but a change in polarity when $\overline{\text{INVERTOUT}}$ is deasserted). As a result, modified target current signal $I_{TGT'}$ is driven to an artificial level outside the normal operating range of target signal level $I_{TGT}$, as indicated by modified target current signal $I_{TGT'}$ falling below "MIN" in FIG. 4.

Such ramping increase in magnitude and change in polarity to target current signal $I_{TGT}$ to generate modified target current signal $I_{TGT'}$ may maintain a slope of the error accumulated by loop filter 204 such that the output current signal $I_{OUT}$ is driven to zero faster than it would in the absence of glitch avoidance module 201. Depending on how long target current signal $I_{TGT}$ is ramped with flipped polarity, loop filter 204 error accumulation may itself change in polarity. However, such change in error accumulation polarity may not change polarity of output current signal $I_{OUT}$ because the output driver of multi-mode current driver 200 is single ended in nature and is unable to drive a current less than zero.

After a designated time (e.g., time $t_2$ shown in FIG. 4) that ensures a zero current for output current signal $I_{OUT}$, glitch avoidance module 201 may flip polarity of target current signal $I_{TGT}$ back to normal, loop filter 204 may be reset, and control switch 220 that drives polarity at the output of multi-mode current driver 200 may ramp the output current signal $I_{OUT}$ at the opposite polarity (as indicated by signal (POLARITY) shown in FIG. 4).

Accordingly, glitch avoidance module 201 may comprise control circuitry configured to, when a load current (e.g., output current signal $I_{OUT}$) is driven in a manner such that the load current changes polarity, reset a state variable of loop filter 204. Such control circuitry may also be configured to reset the state variable of loop filter 204 by driving a target current signal to an artificial level outside a normal operating range of the target signal level (e.g., by modifying target current signal $I_{TGT}$ to generate modified target current signal $I_{TGT'}$). Driving the target current signal to such artificial level may prevent a discontinuity in loop filter 204 and shorten a time required to reset the state variable of loop filter 204 as compared to absence of driving with the artificial level. Such driving of the target signal to such artificial level may also prevent glitches from occurring in the output (e.g., on output current signal $I_{OUT}$).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
   an output stage comprising a single-ended driver for driving a load at an output of the output stage;
   a loop filter coupled at its input to the output of the output stage and configured to minimize an error between a target current signal received by the loop filter and an output current driven on the load; and
   control circuitry configured to, when the load current is driven in a manner such that the load current changes polarity, reset a state variable of the loop filter.

2. The system of claim 1, wherein the loop filter comprises a proportional-integral-derivative controller.

3. The system of claim 1, wherein the control circuitry is configured to reset the state variable of the loop filter by driving the target current signal to an artificial level outside a normal operating range of the target current signal level.

4. The system of claim 3, wherein driving the target current signal to the artificial level avoids a discontinuity associated with the loop filter.

5. The system of claim 4, wherein the discontinuity associated with the loop filter comprises a discontinuity in an input to the loop filter.

6. The system of claim 3, further wherein driving the target current signal to the artificial level shortens a time required to reset the state variable as compared to absence of driving with the artificial level.

7. The system of claim 4, further wherein driving the target current signal to the artificial level avoids glitches occurring at the output.

8. A method comprising:
driving a load at an output of an output stage with a single-ended driver of the output stage;
minimizing an error between a target current signal and an output current driven on the load by a loop filter coupled at its input to the output of the output stage; and
when the load current is driven in a manner such that the load current changes polarity, resetting a state variable of the loop filter.

9. The method of claim 8, wherein the loop filter comprises a proportional-integral-derivative controller.

10. The method of claim 8, further comprising resetting the state variable of the loop filter by driving the target current signal to an artificial level outside a normal operating range of the target current signal level.

11. The method of claim 10, wherein driving the target current signal to the artificial level avoids a discontinuity associated with the loop filter.

12. The method of claim 11, wherein the discontinuity associated with the loop filter comprises a discontinuity in an input to the loop filter.

13. The method of claim 11, further wherein driving the target current signal to the artificial level shortens a time required to reset the state variable as compared to absence of driving with the artificial level.

14. The method of claim 11, further wherein driving the target current signal to the artificial level avoids glitches occurring at the output.

15. A device comprising:
a camera; and
a camera module for controlling the camera, the camera module including a control subsystem comprising:
an output stage comprising a single-ended driver for driving a load at an output of the output stage;
a loop filter coupled at its input to the output of the output stage and configured to minimize an error between a target current signal received by the loop filter and an output current driven on the load; and
control circuitry configured to, when the load current is driven in a manner such that the load current changes polarity, reset a state variable of the loop filter.

16. The device of claim 15, wherein the loop filter comprises a proportional-integral-derivative controller.

17. The device of claim 15, wherein the control circuitry is configured to reset the state variable of the loop filter by driving the target current signal to an artificial level outside a normal operating range of the target current signal level.

18. The device of claim 15, wherein driving the target current signal to the artificial level avoids a discontinuity associated with the loop filter.

19. The device of claim 18, wherein the discontinuity associated with the loop filter comprises a discontinuity in an input to the loop filter.

20. The device of claim 18, further wherein driving the target current signal to the artificial level shortens a time required to reset the state variable as compared to absence of driving with the artificial level.

21. The device of claim 18, further wherein driving the target current signal to the artificial level avoids glitches occurring at the output.

* * * * *

UNITED STATES PATENT AND TRADEMARK OFFICE
CERTIFICATE OF CORRECTION

PATENT NO. : 11,070,177 B2
APPLICATION NO. : 16/562856
DATED : July 20, 2021
INVENTOR(S) : Singh et al.

It is certified that error appears in the above-identified patent and that said Letters Patent is hereby corrected as shown below:

In the Claims

1. In Column 11, Line 1, in Claim 6, delete "claim 3," and insert -- claim 4, --, therefor.

2. In Column 12, Line 21, in Claim 18, delete "claim 15," and insert -- claim 17, --, therefor.

Signed and Sealed this
Fifteenth Day of August, 2023

Katherine Kelly Vidal
*Director of the United States Patent and Trademark Office*